US012696443B2

(12) United States Patent
Huang et al.

(10) Patent No.: US 12,696,443 B2
(45) Date of Patent: Jul. 28, 2026

(54) SEMICONDUCTOR STRUCTURE AND PREPARATION METHOD THEREOF

(71) Applicant: CHANGXIN MEMORY TECHNOLOGIES, INC., Hefei City (CN)

(72) Inventors: Xin Huang, Hefei City (CN); Hongxiang Li, Hefei City (CN); Shih-Shin Wang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 630 days.

(21) Appl. No.: 17/612,209

(22) PCT Filed: Jun. 30, 2021

(86) PCT No.: PCT/CN2021/103871
§ 371 (c)(1),
(2) Date: Oct. 2, 2023

(87) PCT Pub. No.: WO2022/142227
PCT Pub. Date: Jul. 7, 2022

(65) Prior Publication Data
US 2024/0049456 A1 Feb. 8, 2024

(30) Foreign Application Priority Data

Jan. 4, 2021 (CN) .......................... 202110004899.4

(51) Int. Cl.
*H10B 12/00* (2023.01)

(52) U.S. Cl.
CPC ........... *H10B 12/485* (2023.02); *H10B 12/02* (2023.02)

(58) Field of Classification Search
CPC .... H10B 12/485; H10B 12/02; H10B 12/053; H10B 12/01; H10B 12/03; H10B 12/30; H10B 12/48
See application file for complete search history.

(56) References Cited

U.S. PATENT DOCUMENTS 4,624,740 A * 11/1986 Abrams ................ H10P 50/287
257/E21.252
7,262,127 B2 8/2007 Ishikawa
(Continued)

FOREIGN PATENT DOCUMENTS

CN 101197308 A 6/2008
CN 108807282 A 11/2018
(Continued)

OTHER PUBLICATIONS

International Search Report in Application No. PCT/CN2021/103871, mailed on Sep. 22, 2021.

*Primary Examiner* — Victor A Mandala
(74) *Attorney, Agent, or Firm* — Syncoda LLC; Feng Ma

(57) ABSTRACT

A preparation method of the semiconductor structure includes: the substrate including a first area to be etched and a second area to be etched outside the first area to be etched, the etching rate of the first area to be etched and the second area to be etched are different, simultaneously etching the first area to be etched and the second area to be etched at least twice, until an etching depth of one of the first area to be etched and the second area to be etched with a less etching rate is equal to a target etching depth; in at least two etching processes, backfilling a sacrificial material to the first area to be etched and the second area to be etched after a previous etching is completed, removing part of the sacrificial material in a next etching.

20 Claims, 11 Drawing Sheets

(56) References Cited

U.S. PATENT DOCUMENTS

| | | | | |
|---|---|---|---|---|
| 10,170,362 | B2 | 1/2019 | Chang et al. | |
| 10,381,306 | B2 | 8/2019 | Chang et al. | |
| 2005/0272218 | A1* | 12/2005 | Park | H10D 1/042 |
| | | | | 438/386 |
| 2005/0287762 | A1* | 12/2005 | Lee | H10D 64/01352 |
| | | | | 257/E21.546 |
| 2008/0102625 | A1* | 5/2008 | Eckert | H10W 20/081 |
| | | | | 438/643 |
| 2014/0264729 | A1* | 9/2014 | Lee | H10D 62/115 |
| | | | | 257/522 |
| 2021/0391450 | A1* | 12/2021 | More | H10D 30/0245 |
| 2022/0189993 | A1* | 6/2022 | Tirukkonda | H10B 41/10 |
| 2022/0278216 | A1* | 9/2022 | Pitner | H10B 41/27 |
| 2022/0367386 | A1* | 11/2022 | Kuan | H10D 84/0158 |

FOREIGN PATENT DOCUMENTS

| | | |
|---|---|---|
| CN | 112018034 A | 12/2020 |
| CN | 112864156 A | 5/2021 |

* cited by examiner

| |
|---|
| Providing a substrate, the substrate comprises a first area to be etched and a second area to be etched located outside the first area to be etched, and an etching rate of the first area to be etched is different from an etching rate of the second area to be etched |

S101

| |
|---|
| Simultaneously etching the first area to be etched and the second area to be etched at least twice, until an etching depth of one of the first area to be etched and the second area to be etched with a less etching rate is equal to a target etching depth; in at least two etching processes, backfilling a sacrificial material to the first area to be etched and the second area to be etched after a previous etching is completed, removing part of the sacrificial material in a next etching |

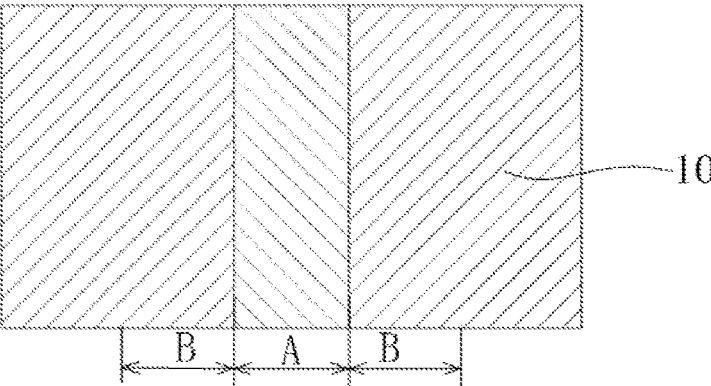

SEMICONDUCTOR STRUCTURE AND PREPARATION METHOD THEREOF

CROSS-REFERENCE TO RELATED APPLICATIONS

This application is a national stage of International Application No. PCT/CN2021/103871 filed on Jun. 30, 2021, which claims priority to Chinese Patent Application No. 202110004899.4, filed on Jan. 4, 2021. The disclosures of the above-referenced applications are hereby incorporated by reference in their entirety.

TECHNICAL FIELD

The present application relates to the technical field of semiconductors, and in particular to a semiconductor structure and a preparation method thereof.

BACKGROUND

The preparation process of the semiconductor structure usually includes a plurality of processes, such as photolithography, deposition, curing, annealing and the like. During photolithography, different materials are usually etched at the same time to form a desired pattern in the semiconductor structure. However, in the patterns formed after etching, a height difference is easily formed at the junction of different materials, which affects the yield of the semiconductor structure.

Taking the preparation of the dynamic random access memory (DRAM) as an example, the DRAM usually includes a substrate, the substrate provides an active area and a shallow trench isolation area, and a word line (WL) is provided in the active area. The bit line contact window (BLC) formed in the substrate, in the bit line contact window at least part of the active area is exposed. When the BLC window is formed, the shallow trench isolation area and the active area are usually etched at the same time, and there is a height difference at the bottom of the formed BLC window. With the increase of the etching depth or the offset of the BLC window relative to the active area, the height difference will also increase, resulting in an increased risk of the BLC window extending to the WL. Further, the risk of a short circuit between the bit line formed in the BLC window and the word line is increased, and the yield of the DRAM is reduced.

SUMMARY

In view of this, the embodiment of the present application provides a semiconductor structure and a preparation method thereof, which are used to reduce the height difference at the junction of different materials when different materials are simultaneously etched, so as to improve the yield of the semiconductor structure.

To achieve the above purposes, the embodiment of the present application provides the technical solution comprises:

In the first aspect, the embodiment of the present application provides a manufacturing method for a semiconductor structure, including: providing a substrate, the substrate comprises a first area to be etched and a second area to be etched located outside the first area to be etched, and an etching rate of the first area to be etched is different from an etching rate of the second area to be etched; and simultaneously etching the first area to be etched and the second area to be etched at least twice, until an etching depth of one of the first area to be etched and the second area to be etched with a less etching rate is equal to a target etching depth; in at least two etching processes, backfilling a sacrificial material to the first area to be etched and the second area to be etched after a previous etching is completed, removing part of the sacrificial material in a next etching.

The manufacturing method for the semiconductor structure provided by the embodiment of the present application has the following advantages:

The manufacturing method for the semiconductor structure provided by the embodiment of the present application, a substrate is provided first, the substrate includes a first area to be etched and a second area to be etched with different etching rates, the first area to be etched is located outside the second area to be etched; the first area to be etched and the second area to be etched are simultaneously etched at least twice; one of the first area to be etched and the second area to be etched with a less etching rate is etched to the target etching depth; in at least two etching processes, the sacrificial material is backfilling in the first area to be etched and the second area to be etched after the previous etching is completed to reduce the difference of the etching depths between the first area to be etched and the second area to be etched, and part of the sacrificial material is removed in the next etching to continue the etching of the first area to be etched and second area to be etched with different etching rates. Compared with the related technology, one etching to the target etching depth, in the embodiment of the present application, part of the difference of the etching depths between the first area to be etched area and the second area to be etched can be eliminated after backfilling, reducing the difference of the final etching depths between the first area to be etched and the second area to be etched. In this way, the possibility of the first area to be etched or the second area to be etched being etched through can be reduced, thereby improving the yield of the semiconductor structure.

In the manufacturing method for the semiconductor structure as described above, the etching rate of the sacrificial material satisfies the following relation:

$$\min(s_1, s_2) < v \leq \max(s_1, s_2);$$

wherein, $s_1$ is the etching rate of the first area to be etched, $s_2$ is the etching rate of the second area to be etched, and vis the etching rate of the sacrificial material.

In the manufacturing method for the semiconductor structure as described above, the etching rate of the first area to be etched is less than the etching rate of the second area to be etched, and the removing part of the sacrificial material in a next etching includes: removing the sacrificial material located in the first area to be etched and part of the sacrificial material located in the second area to be etched in a next etching.

In the manufacturing method for the semiconductor structure as described above, after the first area to be etched and the second area to be etched are simultaneously etched at twice, the etching depth of the first area to be etched is equal to the target etching depth.

In the manufacturing method for the semiconductor structure as described above, the removing part of the sacrificial material in a next etching includes: simultaneously etching the sacrificial material located in the first area to be etched and the second area to be etched until the sacrificial material in the first area to be etched is removed; and simultaneously etching the substrate located in the first area to be etched and the sacrificial material located in the second area to be etched, or, simultaneously etching the substrate located in the first area to be etched and the sacrificial material and the substrate in the second area to be etched, until the etching depth of the first area to be etched is equal to the target etching depth.

In the manufacturing method for the semiconductor structure as described above, the etching depth of the first area to be etched after a first etching is greater than or equal to ½ of the target etching depth and less than or equal to ¾ of the target etching depth.

In the manufacturing method for the semiconductor structure as described above, the sacrificial material is the same as a material of the second area to be etched.

In the manufacturing method for the semiconductor structure as described above, when the etching depth of the first area to be etched is equal to the target etching depth, the etching depth h of the second area to be etched satisfies the following relation:

$$h=a\times k+[a\times(1-k)]\times m;$$

wherein, a is the target etching depth, k is a first etching ratio, $0<k<1$, m is a ratio of the etching rate of the second area to be etched to the etching rate of the first area to be etched.

In the manufacturing method for the semiconductor structure as described above, before performing a first etching on the first area to be etched and the second area to be etched, the forming a mask layer on the substrate; and forming a mask opening in the mask layer penetrating the mask layer, and the mask opening is opposite to the first area to be etched and the second area to be etched.

In the manufacturing method for the semiconductor structure as described above, forming an initial target opening connected with the mask opening after the first etching; backfilling the sacrificial material to the first area to be etched and the second area to be etched, filling the mask opening and the initial target opening and covering the mask layer by the sacrificial material.

In the manufacturing method for the semiconductor structure as described above, after the backfilling the sacrificial material to the first area to be etched and the second area to be etched, further includes: performing a flattening treatment on the sacrificial material so that a flattened surface of the sacrificial material is flush with a surface of the mask layer.

In the manufacturing method for the semiconductor structure as described above, forming a bit line contact window after the simultaneously etching the first area to be etched and the second area to be etched at least twice, the first area to be etched is part of an active area, the second area to be etched is part of a shallow trench isolation area.

In the semiconductor structure as described above, the sacrificial material is formed by chemical vapor deposition or physical vapor deposition.

In the second aspect, the embodiment of the present application provides a semiconductor structure, including: a substrate, forming a target opening in the substrate, the target opening is formed by etching at least twice simultaneously on a first area to be etched and second area to be etched of the substrate, and an etching rate of the first area to be etched is different from an etching rate of the second area to be etched; and in at least two etching processes, a sacrificial material is backfilled in the first area to be etched and the second area to be etched after a previous etching is completed, and part of the sacrificial materials is removed in the next etching.

The semiconductor structure provided in the embodiment of the present application has the following advantages:

The semiconductor structure provided in the embodiment of the present application including the structure, the target opening in the structure is formed by simultaneously etching the first area to be etched and the second area to be etched of the structure at least twice, due to the different etch rates of the first area to be etched and second area to be etched, the etching depth of the first area to be etched is different from that of the second area to be etched after a previous etching is completed. By backfilling the sacrificial material in the first area to be etched and the second area to be etched, the difference of etched depths between the first area to be etched and second area to be etched is reduced, part of the sacrificial material is removed in the next etching, so as to continue to etch the first area to be etched and the second area to be etched with different etching rates. Compared with the related technology, one etching to the target etching depth, in the embodiment of the present application, the difference of the etching depths between the first area to be etched and the second area to be etched can be eliminated after backfilling, reducing the difference of the final etching depths between the first area to be etched and the second area to be etched. In this way, the possibility of the first area to be etched or the second area to be etched being etched through can be reduced, thereby improving the yield of the semiconductor structure.

For the semiconductor structure as described above, the target opening is formed by etching twice simultaneously the first area to be etched and second area to be etched, the etching rate of the first area to be etched is less than the etching rate of the second area to be etched; an etching depth of the first area to be etched is equal to a target etching depth a, and an etching depth h of the second area to be etched satisfies the following relation:

$$a<h\leq a\times k+[a\times(1-k)]\times m;$$

wherein, k is a first etching ratio, $0<k<1$, m is the ratio of the etching rate of the second area to be etched to the etching rate of the first area to be etched.

For the semiconductor structure as described above, the target opening is a bit line contact window, the first area to be etched is part of an active area, the second area to be etched is part of a shallow trench isolation area.

For the semiconductor structure as described above, a mask layer is formed on the structure, and the mask layer is formed with a mask opening corresponding to the bit line contact window; and a material of the shallow trench isolation area comprises silicon oxide, a material of the active area comprises silicon, and a material of the mask layer comprises silicon nitride.

BRIEF DESCRIPTION OF THE DRAWINGS

FIG. 1 is a schematic flowchart of a preparation method of the semiconductor structure according to an embodiment of the present application;

FIG. 2 is a schematic structure diagram of a substrate according to an embodiment of the present application;

DETAILED DESCRIPTION

Figure 3:
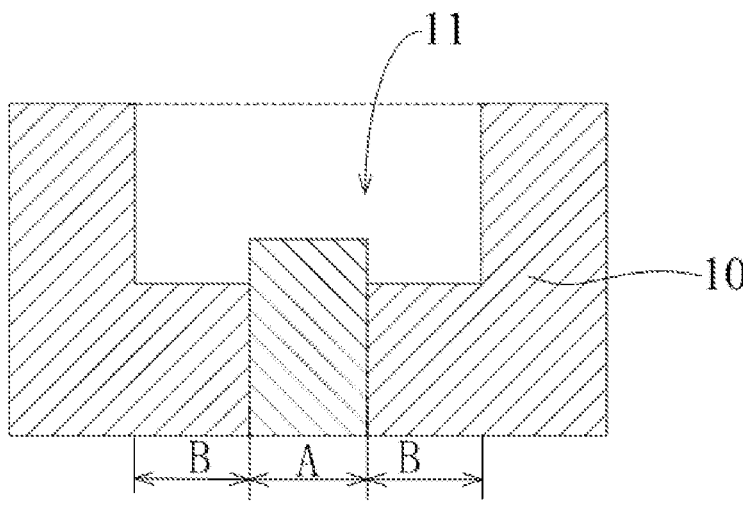
FIG. 3 is a schematic structure diagram after forming an initial target opening according to an embodiment of the present application.

In order to improve the yield of the semiconductor structure, an embodiment of the present application provides a preparation method of a semiconductor structure. Simultaneously, the first area to be etched and the second area to be etched with different etching rates are etched at least twice, and in at least two etching processes, the first area to be etched and the second area to be etched are backfilled with sacrificial material after the previous etching is completed, and part of the sacrificial material is removed in the next etching. After backfilling, part of the difference of the etching depths between the first area to be etched and the second area to be etched can be eliminated, thereby reducing the difference of the final heights between the first area to be etched and the second area to be etched. In this way, the possibility of the first area to be etched or the second area to be etched being etched through can be reduced, finally the yield of the semiconductor structure can be improved.

To make the objectives, technical solutions and advantages of the present application clearer, the technical solutions in the embodiments of present application will be clearly and completely described with reference to the accompanying drawings in the embodiments of the present application. It should be understood that the embodiments described herein are merely a part rather than all of the embodiments of the present application. All other embodiments obtained by those of ordinary skill in the art based on the embodiments of the present application without creative efforts should fall within the protection scope of the present application.

One Embodiment

As shown in FIG. 1, FIG. 1 is a schematic flowchart of a preparation method of the semiconductor structure according to an embodiment of the present application. The preparation method of the semiconductor structure includes:

S101: providing a substrate, the substrate comprises a first area to be etched and a second area to be etched located outside the first area to be etched, and an etching rate of the first area to be etched is different from an etching rate of the second area to be etched.

The substrate includes the first area to be etched and the second area to be etched. In one possible example, referring to FIG. 2, the first area to be etched is shown at A in FIG. 2, and the second area to be etched is shown at B in FIG. 2. The second area to be etched surrounds the first area to be etched and is adjacent to the first area to be etched so that the first area to be etched and the second area to be etched can be etched simultaneously.

An etching rate of the first area to be etched is different from an etching rate of the second area to be etched, that is, the etching rate of the first area to be etched may be greater than or less than the etching rate of the second area to be etched. It should be understood that the first area to be etched and the second area to be etched can be made of different materials, and the etching rate of the material located in the first area to be etched is different from that of the material located in the second area to be etched.

In the embodiment of the present application, the etching rate of the first area to be etched is less than that of the second area to be etched. Exemplarily, the material in the first area to be etched may be silicon and the material in the second area to be etched may be silicon oxide.

S102: simultaneously etching the first area to be etched and the second area to be etched at least twice, until the etching depth of one of the first area to be etched and the second area to be etched with a less etching rate is equal to the target etching depth. In at least two etching processes, backfilling the sacrificial material to the first area to be etched and the second area to be etched after the previous etching is completed, removing part of the sacrificial material in the next etching.

In this step, simultaneously the first area to be etched and the second area to be etched are etched at least twice to finally form the desired target opening 12. The bottom surface of the target opening 12 has a height difference, which is formed by part of the bottom surface of the first area to be etched and part of the second area to be etched respectively. The minimum depth of the target opening 12 is the target etching depth, that is, the etching depth of one of the first area to be etched and the second area to be etched with a less etching rate after at least two etchings.

In order to reduce the height difference, in the process of the at least two etchings, the sacrificial material 20 is backfilled in the first area to be etched and the second area to be etched after the previous etching is completed, and part of the sacrificial material 20 is removed in the next etching, so that the first area to be etched and the second area to be etched with different etching rates are continued to be etched simultaneously.

Sacrificial material 20 can be formed by chemical vapor deposition or physical vapor deposition in the first area to be etched and the second area to be etched. The etching rate of sacrificial material 20 lies between the etching rate of the first area to be etched and the etching rate of the second area to be etched. Exemplarily, the etching rate of the sacrificial material 20 satisfies the following relation:

$$\min(s_1, s_2) < v \leq \max(s_1, s_2)$$

wherein, S1 is the etching rate of the first area to be etched, s2 is the etching rate of the second area to be etched, and V is the etching rate of sacrificial material 20.

The sacrificial material 20 maybe the same as or different from the material of the substrate 10 in the second area to be etched. For example, the material of the substrate 10 in the first area to be etched maybe silicon, the material of the substrate 10 in the second area to be etched maybe silicon oxide, and the sacrificial material 20 may be one or more of silicon oxide, silicon nitride, silicon nitride, etc.

In the embodiment of the present application, when the first area to be etched and the second area to be etched are etched simultaneously twice, the first to be etched and the second area to be etched are backfilled between the two etching processes. When the first area to be etched and the second area to be etched are etched simultaneously three times or more, the number of the backfilling is less than the number of the etching, and more than one.

It should be noted that when the first area to be etched and the second area to be etched are etched simultaneously three times or more, the first and second areas to be etched maybe backfilled between any two adjacent etching processes.

Exemplarily, when the first area to be etched and the second area to be etched are etched simultaneously four times, the first area to be etched and the second area to be etched can be backfilled only after the first etching, the second etching or the third etching, the number of backfilling is one; and the first area to be etched and the second area to be etched can be backfilled after the first etching and second etching, the first etching and the third etching or the second etching and the third etching, the number of backfilling is two; the first area to be etched and the second area to be etched can be backfilled after the first etching, the second etching and the third etching, that is, the number of backfilling is three.

It should be noted that after the previous etching is completed, an initial target opening 11 is formed in the first area to be etched and the second area to be etched, and the backfilled sacrificial material 20 fills the initial target opening 11. It is understood that the initial target opening 11 is different after each etching is completed, that is, the initial target opening 11 changes over the etching process.

In the next etching, when the first area to be etched and the second area to be etched are etched simultaneously, the sacrificial material 20 in the first area to be etched and the second area to be etched are first etched simultaneously to remove the sacrificial material located in the first area to be etched or in the second area to be etched; then, the first area to be etched and the second area to be etched are etched simultaneously. At this time, the material to be etched located in the first area to be etched is different from the material to be etched located in the second area to be etched, that is, the etching rates of the first area to be etched and the second area to be etched are different. It should be noted that the above two simultaneous etching process of the first to be etched and the second area to be etched can be completed in the same step.

In some possible examples, the etching rate of the first area to be etched is less than the etching rate of the second area to be etched. After the first area to be etched and the second area to be etched are etched simultaneously twice, the etching depth of the first area to be etched is equal to the target etching depth.

Referring to FIG. 3, the first etching is performed simultaneously on the first area to be etched and the second area to be etched to form the initial target opening 11. Exemplarily, the etching depth of the first area to be etched may be greater than or equal to ½ of the target etching depth and less than or equal to ¾ of the target etching depth.

Due to the etching rate of the first area to be etched is less than that of the second area to be etched, the first area to be etched is slower to etch corresponding to the second area to be etched, and the etching depth of the first area to be etched is less than that of the second area to be etched. As shown in FIG. 3, the depth of the initial target opening 11 at the first area to be etched is less than the depth of the initial target opening 11 at the second area to be etched.

Figure 4:
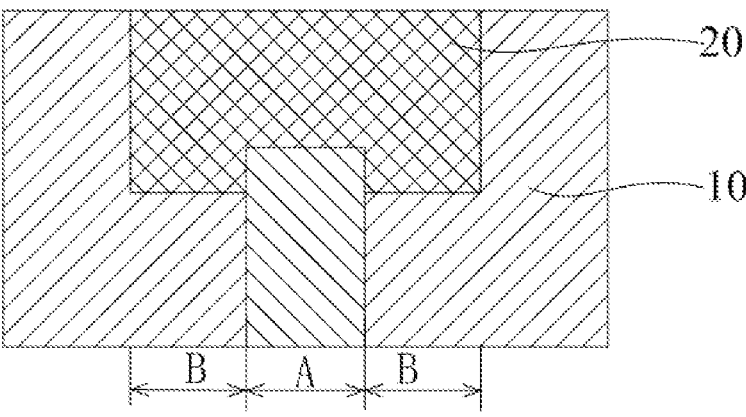
FIG. 4 is a schematic structure diagram after backfilling the sacrificial material according to an embodiment of the present application.

Referring to FIG. 4, after the first etching is completed, sacrificial material 20 is backfilled in the first area to be etched and the second area to be etched. The backfilled sacrificial material 20 fills the initial target opening 11, as shown in FIG. 4, and the upper surface of the sacrifice material 20 is flush with substrate 10.

The etching rate of the sacrificial material 20 lies between the etching rate of the first area to be etched and the etching rate of the second area to be etched. In the embodiment of the present application, the sacrificial material 20 is the same material as the substrate 10 in the second area to be etched, that is, the sacrificial material 20 is the same as the material of the one of the first area to be etched and the second area to be etched with the greater etching rate. In this way, when the sacrificial material 20 is not completely removed after the second etching, the remaining sacrificial material 20 does not need to be removed, which improves the preparation efficiency of semiconductor structure.

After backfilling the sacrificial material 20, the sacrificial material 20 located in the first area to be etched and part of the sacrificial material 20 located in the second area to be etched are removed, and the second etching is performed simultaneously on the first area to be etched and the second area to be etched with different etching rates. The desired target opening 12 on the substrate 10 is formed after the second etching is completed.

Figure 5:
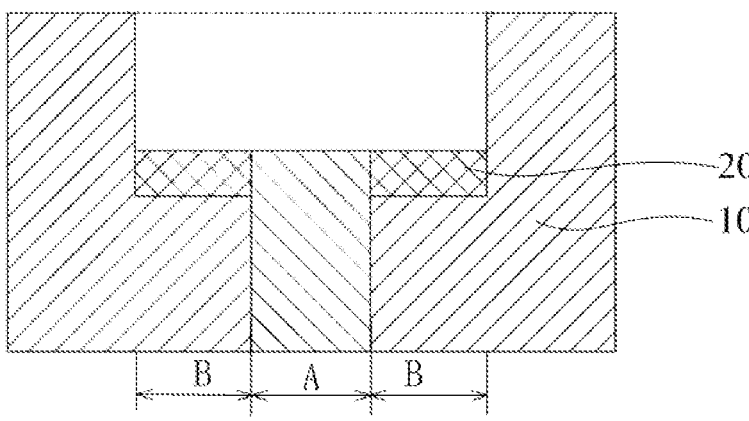
FIG. 5 is a schematic structure diagram after removing part of the sacrificial material according to an embodiment of the present application.

When performing the second etching on the first area to be etched and the second area to be etched at the same time, the sacrificial material 20 located in the first area to be etched and the second area to be etched is removed by etching firstly, until the sacrificial material 20 in the first area to be etched is completely removed. As shown in FIG. 5, in the second area to be etched, part of the sacrificial material 20 is removed, and part of the sacrificial material 20 remains.

When the sacrificial material 20 is removed, there is no etching depth difference between the first area to be etched and the second area to be etched. When the sacrificial material 20 located in the first area to be etched is completely removed, the sacrificial material 20 in the second area to be etched is removed from the part corresponding to the first area to be etched, so that the substrate 10 of the first area to be etched is flush with the upper surface of the sacrificial material 20 in the second area to be etched.

Then, the substrate 10 located in the first area to be etched and the sacrificial material 20 located in the second area to be etched are simultaneously etched, or the substrate 10 located in the first area to be etched and the sacrificial material 20 and the substrate 10 located in the second area to be etched are simultaneously etched, until the etching depth in the first area to be etched is equal to the target etching depth.

Figure 6:
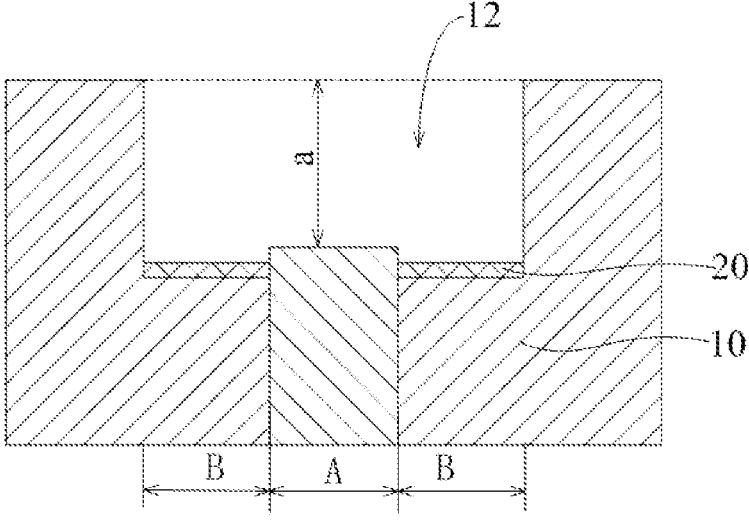
FIG. 6 is a schematic structure diagram of forming a target opening according to an embodiment of the present application.

In one possible embodiment, as shown in FIG. 6, part of the sacrificial material 20 is removed from the second area to be etched when the etching depth of the first area to be etched is equal to the target etching depth. The depth of the target opening 12 in second area to be etched is less than the depth of the initial target opening 11 in the second area to be etched, part of the sacrificial material 20 remains in the second area to be etched. That is, the substrate 10 and part of the sacrificial material 20 located in the second area to be etched are simultaneously etched to form the desired target opening 12.

Figure 7:
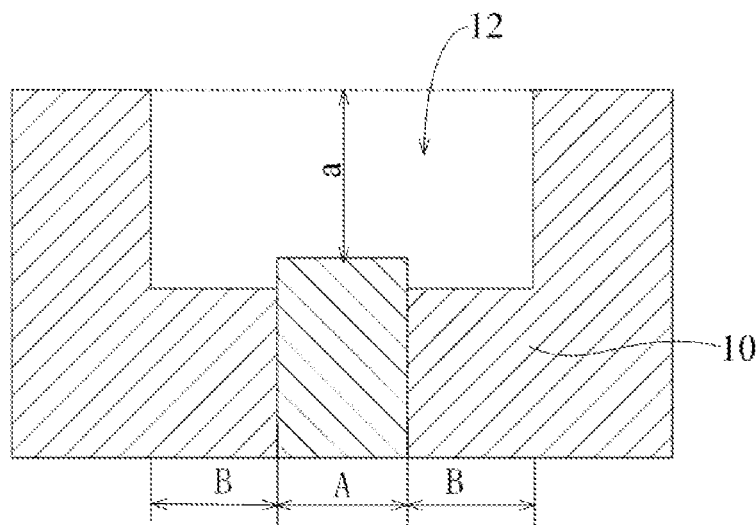
FIG. 7 is another schematic structure diagram of forming a target opening according to an embodiment of the present application.

In another possible embodiment, as shown in FIG. 7, all the sacrificial material 20 located in the second area to be etched is removed when the etching depth of the first area to be etched is equal to the target etching depth. The depth of the target opening 12 in second area to be etched is equal to the depth of the initial target opening 11 in the second area to be etched. That is, the substrate 10 located in the second area to be etched and all the sacrificial material 20 located in the second area to be etched are simultaneously etched to form the desired target opening 12.

Figure 8:
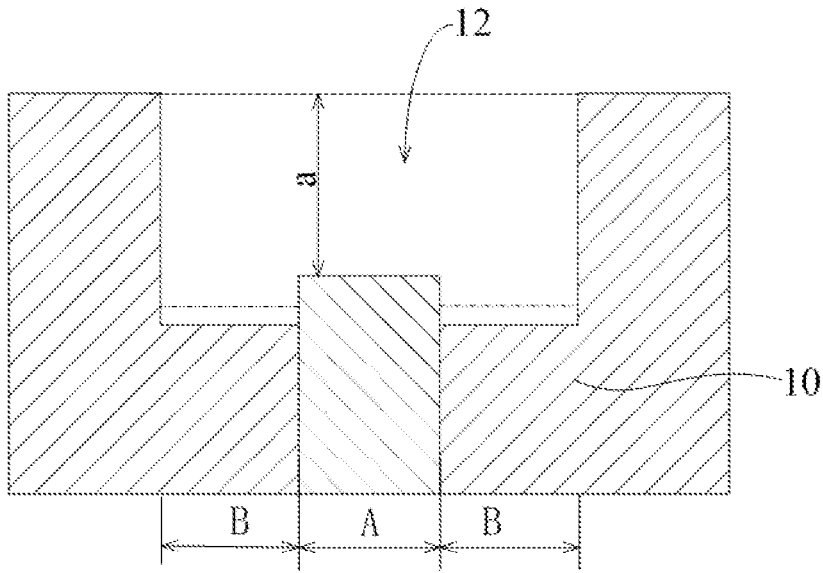
FIG. 8 is yet another schematic structure diagram of forming a target opening according to an embodiment of the present application.

In another possible embodiment, as shown in FIG. 8, all the sacrificial material 20 and part of the substrate 10 located in the second area to be etched are removed when the etching depth of the first area to be etched is equal to the target etching depth. As shown in FIG. 8, the position shown by the two-dot chain line indicates the depth of the initial target opening 11 in the second area to be etched, and the depth of the target opening 12 in the second area to be etched is greater than the depth of the initial target opening 11 in the second area to be etched. That is, all the sacrificial material 20 and part of substrate 10 located in the second area to be etched are simultaneously etched to form the desired target opening 12.

Figure 9:
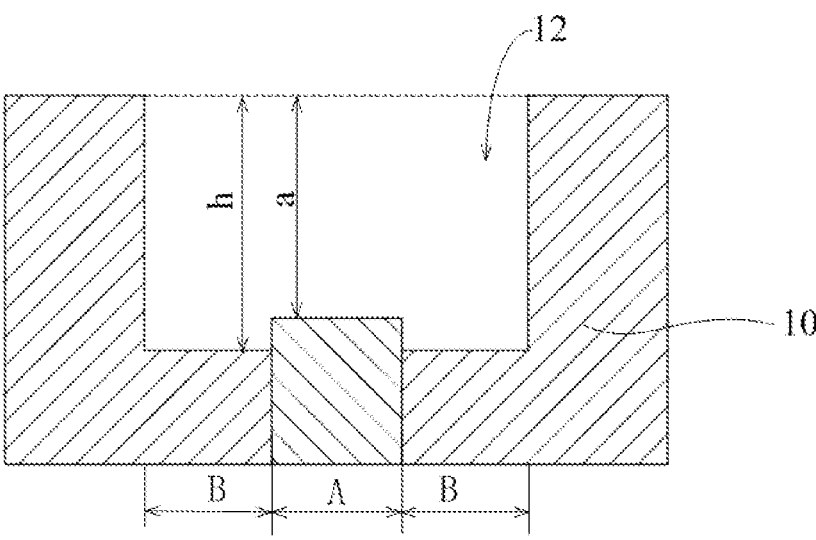
FIG. 9 is a schematic structure diagram of a target opening according to an embodiment of the present application.

In the embodiment of the present application, the sacrificial material 20 is the same as the material in the second area to be etched, as shown in FIG. 9. When the etching depth of the first area to be etched is equal to the target etching depth a, the etching depth h of the second area to be etched satisfies the following relation:

$$h = a \times k + [a \times (1-k)] \times m$$

wherein, k is the first etching ratio, $0 < k < 1$, m is the ratio of the etching rate of the second area to be etched to the first area to be etched.

The difference value y of the etching depths between the first area to be etched and the second area to be etched is:

$$y = h - a = a \times (m-1) + a \times k \times (1-m);$$

Figure 10:
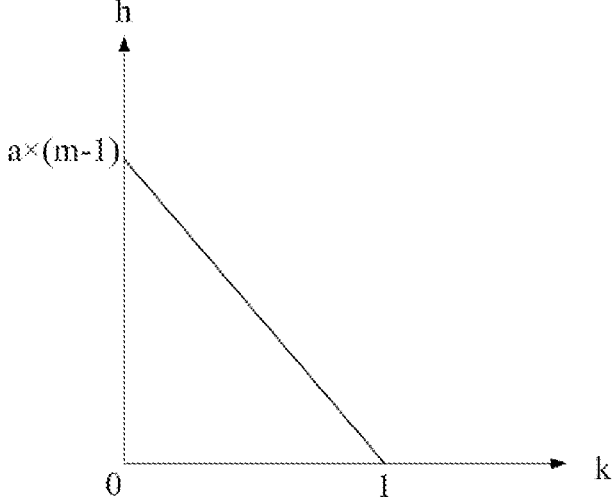
FIG. 10 is a relation diagram between the first etching ratio k and the difference value h of the etching depths between the first to be etched area and the second to be etched area according to an embodiment of the present application.

Taking k as the independent variable and y as the dependent variable to draw a graph, as shown in FIG. 10. As can be seen from the figure, as the value of k gradually increases, the value of y gradually decreases, and there is a negative linear correlation between k and y. That is to say, during the first etching, when the etching depth of the first area to be etched is closer to the target etching depth, the height difference formed by the first area to be etched and the second area to be etched is smaller. However, the greater the etching depth of the first area to be etched, the greater the difficulty of backfilling. Therefore, it is necessary to select an appropriate value of k according to the actual process and actual working conditions.

Exemplarily, when the ratio m of the etching rate of the second area to be etched to the etching rate of the first area to be etched is 1.5, the first etching ratio k is ¾. When the target etching depth a is 40 nm, the target opening 12 is formed by a single etching. The etching depth of the first area to be etched is 40 nm, and the etching depth of the second area to be etched is 60 nm. The difference of the etching depths between the first area to be etched and the second area to be etched is 20 nm. After the target opening 12 is formed in the embodiment of the present application, the etching depth of the first area to be etched is 40 nm, the etching depth of the second area to be etched is 45 nm, the difference of the etching depths between the first area to be etched and the second area to be etched is 5 nm, and the difference of the etching depths between the first and second areas to be etched is reduced.

In the preparation method of the semiconductor structure provided in the embodiment of the present application, the substrate 10 is first provided, the substrate 10 comprises the first area to be etched and the second area to be etched with different etching rates, and the first area to be etched is located outside the second area to be etched; the first area to be etched and the second area to be etched are simultaneously etched at least twice, until the etching depth of one of the first area to be etched and the second area to be etched with a less etching rate is equal to the target etching depth. In at least two etching processes, the sacrificial material 20 is backfilled in the first area to be etched and the second area to be etched after the previous etching is completed, the difference of etched depths between the first area to be etched and the second area to be etched is reduced, part of the sacrificial material 20 is removed during the next etching, so as to continue to etch the first area to be etched and the second area to be etched with different etching rates. One etching to the target etching depth, in the embodiment of the present application, part of the difference of the etching depths between the first area to be etched and the second area to be etched can be eliminated after backfilling, reducing the difference of the final heights between the first area to be etched and the second area to be etched. In this way, the possibility of the first area to be etched or the second area to be etched being etched through can be reduced, thereby improving the yield of the semiconductor structure.

Figure 11:
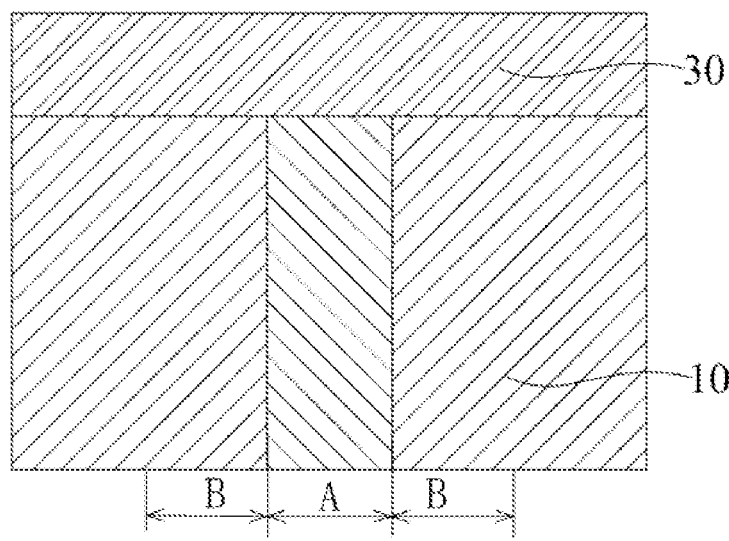
FIG. 11 is a schematic structure diagram of a mask layer and a substrate according to an embodiment of the present application.

In the embodiment of the present application, before simultaneously performing the first etching on the first area to be etched and the second area to be etched, the preparation method further includes:

Firstly, forming a mask layer 30 on the substrate 10. As shown in FIG. 11, the mask layer 30 can be deposited on the substrate 10, the mask layer 30 covers the first area to be etched and the second area to be etched. The mask layer 30 can be made of silicon nitride.

Secondly, a mask opening 31 penetrating the mask layer 30 is formed in the mask layer 30, and the mask opening 31 is opposite to the first area to be etched and the second area to be etched. The mask opening 31 penetrates the mask layer 30 to expose substrate 10. The mask opening 31 is opposite to the first area to be etched and part of the second area to be etched.

Figure 12:
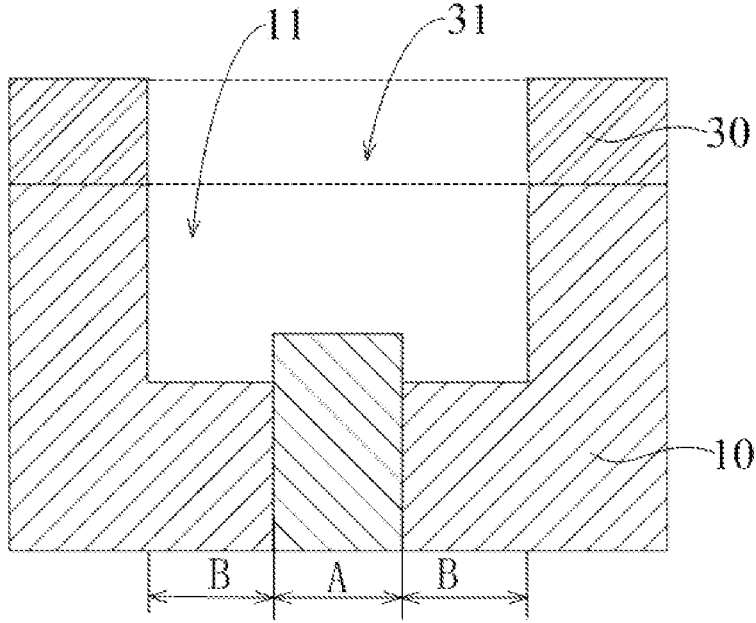
FIG. 12 is a schematic structure diagram of a mask opening and an initial target opening according to an embodiment of the present application.

In the embodiment of the present application, when the first area to be etched and the second area to be etched are simultaneously etched twice, the etched substrate 10 is located in the area within the mask opening 31. Referring to FIG. 12, an initial target opening 11 is formed in substrate 10 after the first etching, and the initial target opening 11 is connected to the mask opening 31.

Figure 13:
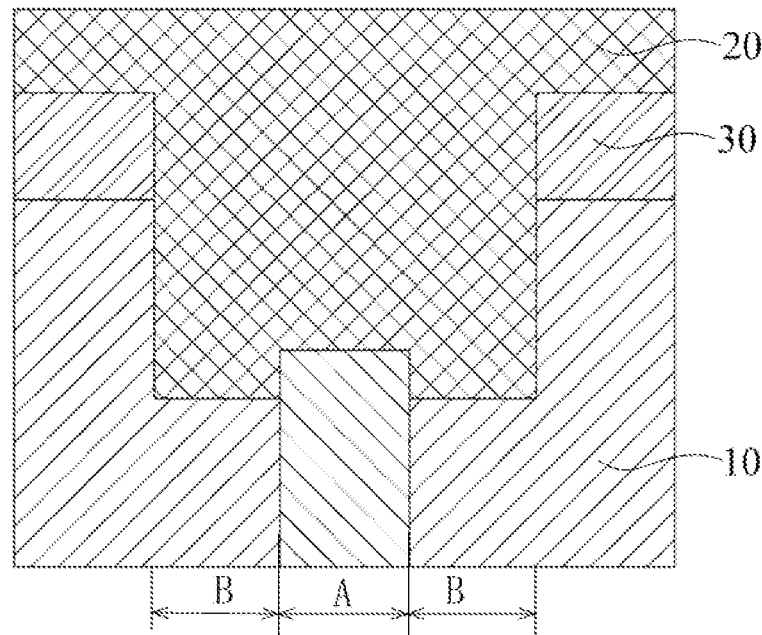
FIG. 13 is a schematic structure diagram after backfilling the sacrificial material to a mask opening and an initial target opening according to an embodiment of the present application.

Referring to FIG. 13, the initial target opening 11 connected with the mask opening 31 is formed after the previous etching. When backfilling the sacrificial material 20 to the first and second areas to be etched, sacrificial material 20 fills the mask opening 31 and the initial target opening 11, and covers the mask layer 30.

Figure 14:
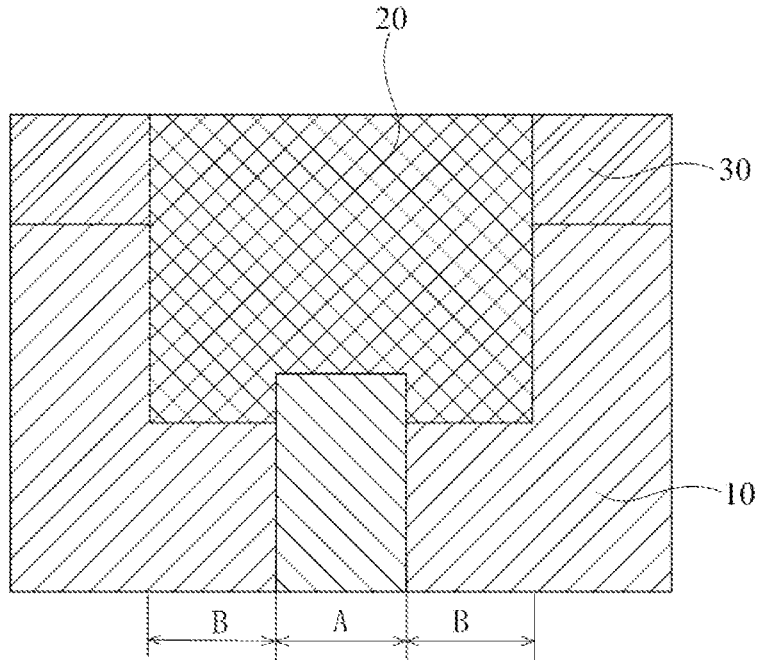
FIG. 14 is a schematic structure diagram of after performing the flattening treatment according to an embodiment of the present application.

Referring to FIG. 14, after the sacrificial material 20 is backfilled in the first area to be etched and the second area to be etched, the preparation method further includes: performing the flattening treatment on the sacrificial material 20, and the surface of the sacrificial material 20 after flattening is flush with the surface of the mask layer 30.

Exemplarily, the upper surface of the sacrificial material 20 is performed the flattening treatment with the Chemical Mechanical Polish (CMP), so that the upper surface of the sacrificial material 20 is flush with the upper surface of the mask layer 30. In this way, when sacrificial material 20 is etched, the etching depth of sacrificial material 20 is consistent, which can reduce or avoid the unevenness or inclination of the bottom surface of the sacrificial material 20.

Figure 15:
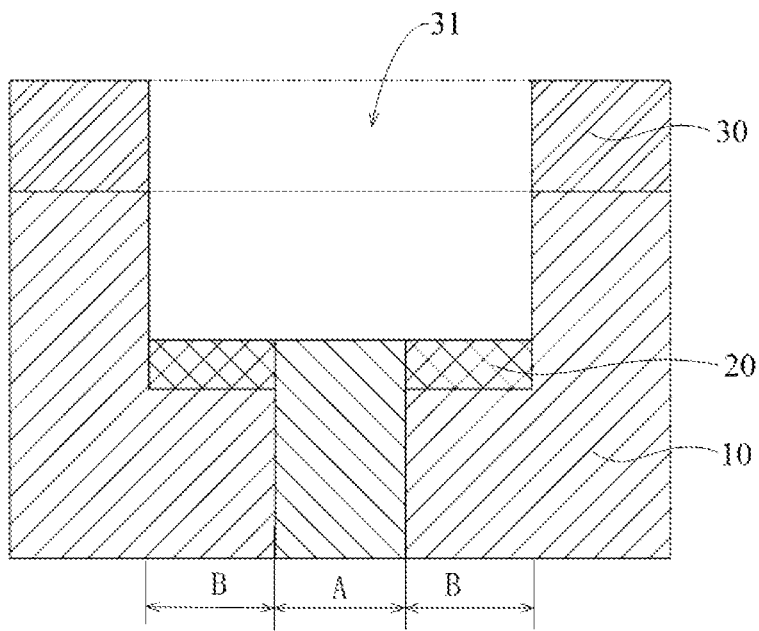
FIG. 15 is a schematic structure diagram after removing part of the sacrificial material of the mask opening, the first area to be etched and the second area to be etched according to an embodiment of the present application.

After backfilling the sacrificial material 20, a second etching is performed simultaneously on the first area to be etched and second area to be etched. As shown in FIG. 15, the sacrificial material 20 in the mask opening 31 is removed, and all the sacrificial material 20 in the first area to be etched and part of the sacrificial material 20 in the second area to be etched are removed, part of the sacrificial material 20 in the second area to be etched retains.

When the etching continues, the etching rate of the first area to be etched is different from that of the second area to be etched. When the etching depth of the first area to be etched is equal to the target etching depth, the second etching is completed, and the first area to be etched and the second area to be etched form the target opening 12 as shown in FIG. 16.

In one possible example, the target opening 12 may be a line contact window, that is, the preparation method of the embodiment of the present application can be applied to the formation of a line contact window of a memory. That is, the first area to be etched and the second area to be etched are simultaneously etched at least twice to form a bit line contact window. The first area to be etched is part of the active area, and the second area to be etched is part of shallow trench isolation (STI).

The Second Embodiment

Figure 16:
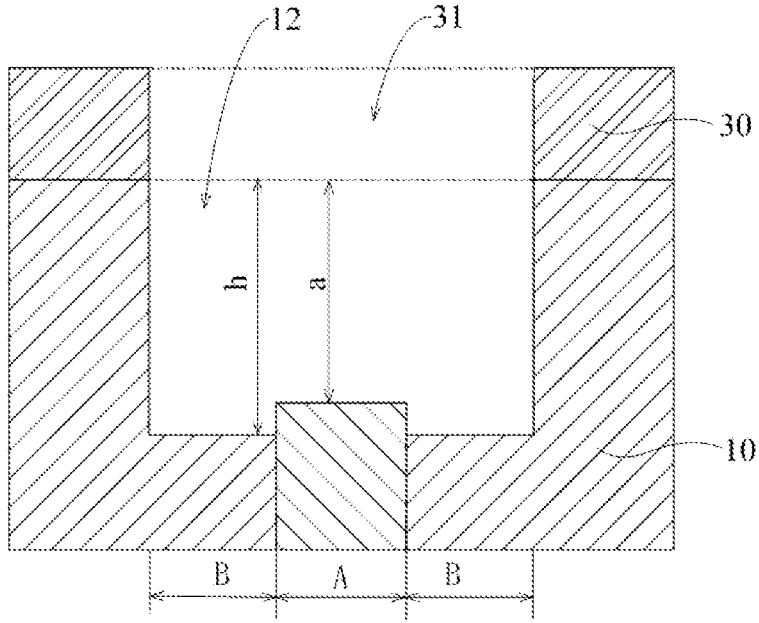
FIG. 16 is a schematic structure diagram of a mask opening and a target opening according to an embodiment of the present application.

Referring to FIG. 16, the semiconductor structure in the embodiment of the present application comprises a substrate 10, the substrate 10 includes a first area to be etched and a second area to be etched. In one possible example, the first area to be etched is shown at A in FIG. 16, and the second area to be etched is shown at B in FIG. 16. The second area to be etched surrounds the first area to be etched and is adjacent to the first area to be etched so that the first area to be etched and the second area to be etched can be etched simultaneously.

An etching rate of the first area to be etched is different from an etching rate of the second area to be etched, that is, the etching rate of the first area to be etched may be greater or less than the etching rate of the second area to be etched. It should be understood that the first area to be etched and the second area to be etched can be different materials, and the etching rate of the material located in the first area to be etched is different from the material located in the second area to be etched.

Continuing to refer to FIG. 16, the target opening 12 is also formed in the substrate 10. The target opening 12 is formed by simultaneously etching the first area to be etched and the second area to be etched of the substrate 10 at least twice. In at least two etching processes, the sacrificial material 20 is backfilled in the first area to be etched and the second area to be etched, after the previous etching is completed, and part of the sacrificial material 20 is removed during the next etching.

The first area to be etched and the second area to be etched form an initial target opening 11, after the previous etching is completed. The sacrificial material 20 can be formed in the first area to be etched and the second area to be etched by chemical vapor deposition or physical vapor deposition, and the etching rate of the sacrificial material 20 lies between the etching rate of the first area to be etched and the etching rate of the second area to be etched.

In the next etching, the sacrificial material 20 in the first area to be etched and the second area to be etched are removed, until the substrate 10 is exposed in the first area to be etched or the second area to be etched, then the remaining sacrificial material 20 and the substrate 10 are simultaneously etched to form the target opening 12.

In a possible example, the etching rate of the first area to be etched is less than the etching rate of the second area to be etched. The first area to be etched and the second area to be etched of the substrate 10 are simultaneously etched twice to form the target opening 12, and the sacrificial material 20 is the same as the material of the second area to be etched.

As shown in FIG. 16, the etching depth of the first area to be etched is equal to the target etching depth a, and the etching depth h of the second area to be etched satisfies the following relationship:

$$a < h \le a \times k + [a \times (1-k)] \times m;$$

Wherein, k is the first etching ratio, 0<k<1, and m is the ratio of the etching rate of the second area to be etched to the etching rate of the first area to be etched.

Figure 17:
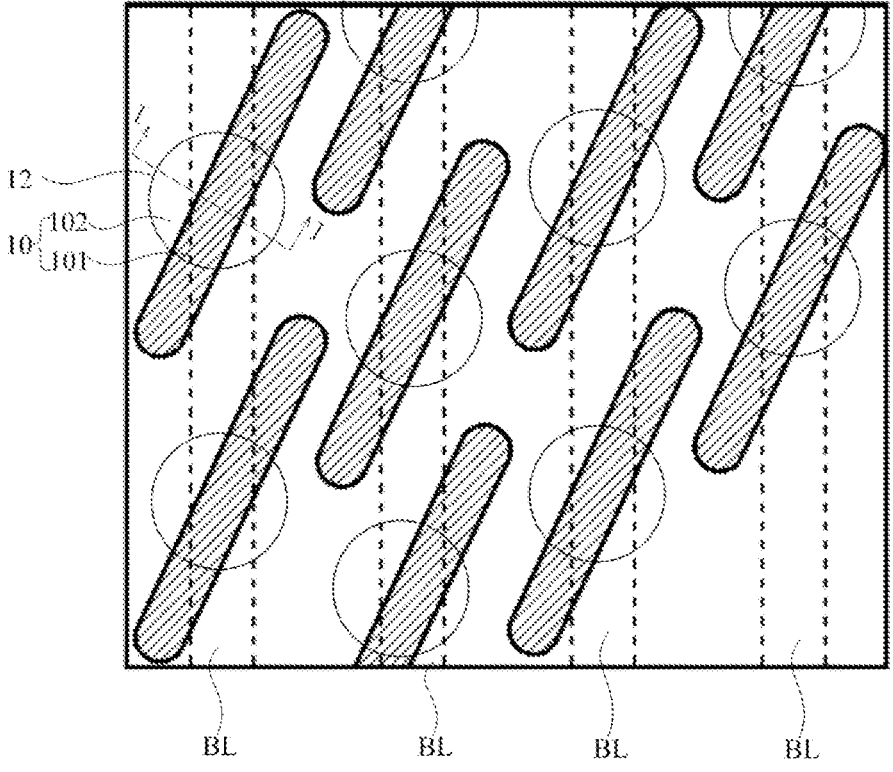
FIG. 17 is a top view of the active area and the shallow trench isolation area according to an embodiment of the present application.

It should be noted that, as shown in FIG. 17, the target opening 12 may be a bit line contact window 12, the first area to be etched may be part of the active area 101, the material of which is silicon. The second area to be etched may be part of the shallow trench isolation area 102, and the material of which may be silicon oxide. The active areas 101 and the shallow trench isolation area 102 constitute the substrate 10. FIG. 16 may be a cross-sectional view along the I-I direction in FIG. 17. The bit line contact structure is formed in the bit line contact window 12 after the bit line contact window 12 is formed. The bit line contact structure can be used to connect a bit line (BL).

It should be noted that a mask layer 30 may also be formed on the substrate 10, the mask layer 30 is formed with the mask opening 31 corresponding to the bit line contact window, and the material of the mask layer 30 may be silicon nitride.

When the sacrificial material 20 is backfilled, the sacrificial material 20 fills the mask opening 31 and the initial target opening 11, and covers the mask layer 30. After the sacrificial material 20 is backfilled, the sacrificial material 20 can be flattened so that the upper surface of the sacrificial material 20 is flush with the mask layer 30 to facilitate subsequent etching.

The semiconductor structure provided in the embodiment of the present application comprises a substrate 10, the target opening 12 in the substrate 10 is formed by simultaneously etching the first area to be etched and the second area to be etched of the substrate 10 at least twice. Since the etching rate of the first area to be etched is different from that of the second area to be etched, after the previous etching is completed, the etching depth of the first area to be etched is different from the etching depth of the second area to be etched. The sacrificial material 20 is backfilled in the first area to be etched and the second area to be etched, the difference of the etching depths between the first area to be etched and the second area to be etched is reduced. Part of the sacrificial material 20 is removed in the next etching, so as to continue to etch the first area to be etched and the second area to be etched with different etching rates. One etching to the target etching depth, in the embodiment of the present application, part of the difference of the etching depths between the first area to be etched and the second area to be etched can be eliminated after backfilling, reducing the difference of the final heights between the first area to be etched and the second area to be etched. In this way, the possibility of the first area to be etched or the second area to be etched being etched through can be reduced, thereby improving the yield of the semiconductor structure.

The embodiments or implementations in this specification are described in a progressive manner, each embodiment focuses on the differences from other embodiments, and the same or similar parts between the various embodiments can be referred to each other.

Those skilled in the art should understand that in the disclosure of the present application, the terms "longitudinal", "lateral", "upper", "lower", "front", "rear", "left", "right", "vertical", "horizontal", "top", "bottom", "inside" and "outside" indicates a location or position relationship is based on the location or position relations shown in the drawings. It is only to describe this application and simplified description, rather than indicating or implying that the system or element referred to must have a particular orientation, be constructed and operate in a particular orientation, such terms shall not be construed as a limitation of this application.

In the description of this specification, reference to descriptions such as "one embodiment", "some embodiments", "exemplary embodiments", "examples", "specific examples", or "some examples" means to combine the embodiments or the specific features, structures, materials, or characteristics described by the examples are included in at least one embodiment or example of the present application. In this specification, the schematic representation of the above-mentioned terms does not necessarily refer to the same embodiment or example. Moreover, the described specific features, structures, materials or characteristics can be combined in an appropriate manner in any one or more embodiments or examples.

Finally, it should be noted that the above embodiments are only used to illustrate the technical solutions of the present application, not to limit it; although the application has been described in detail with reference to the foregoing embodiments, those of ordinary skill in the art should understand that: the technical solutions described in the foregoing embodiments can still be modified, or some or all of the technical features can be equivalently replaced; and these modifications or replacements do not make the essence of the corresponding technical solutions deviate from the scope of the technical solutions of the embodiments of the present application.

What is claimed is:

1. A manufacturing method for a semiconductor structure, comprising:

providing a substrate, the substrate comprises a first area to be etched and a second area to be etched located outside the first area to be etched, and an etching rate of the first area to be etched is different from an etching rate of the second area to be etched; and simultaneously etching the first area to be etched and the second area to be etched at least twice, until an etching depth of one of the first area to be etched and the second area to be etched with a less etching rate is equal to a target etching depth; in at least two etching processes, backfilling a sacrificial material to the first area to be etched and the second area to be etched after a previous etching is completed, removing part of the sacrificial material in a next etching.

2. The manufacturing method according to claim 1, wherein the etching rate of the sacrificial material satisfies the following relation:

$$\min(s_1,s_2)<v\leq\max(s_1,s_2);$$

wherein, $s_1$ is the etching rate of the first area to be etched, $s_2$ is the etching rate of the second area to be etched, and v is the etching rate of the sacrificial material.

3. The manufacturing method according to claim 1, wherein the etching rate of the first area to be etched is less than the etching rate of the second area to be etched, and the removing part of the sacrificial material in a next etching comprises:

removing the sacrificial material located in the first area to be etched and part of the sacrificial material located in the second area to be etched in a next etching.

4. The manufacturing method according to claim 3, wherein after the first area to be etched and the second area to be etched are simultaneously etched at twice, the etching depth of the first area to be etched is equal to the target etching depth.

5. The manufacturing method according to claim 4, wherein the removing part of the sacrificial material in a next etching comprises:

simultaneously etching the sacrificial material located in the first area to be etched and the second area to be etched until the sacrificial material in the first area to be etched is removed; and simultaneously etching the substrate located in the first area to be etched and the sacrificial material located in the second area to be etched, or, simultaneously etching the substrate located in the first area to be etched and the sacrificial material and the substrate in the second area to be etched, until the etching depth of the first area to be etched is equal to the target etching depth.

6. The manufacturing method according to claim 4, wherein, the etching depth of the first area to be etched after a first etching is greater than or equal to ½ of the target etching depth, and less than or equal to ¾ of the target etching depth.

7. The manufacturing method according to claim 4, wherein, the sacrificial material is the same as a material of the second area to be etched.

8. The manufacturing method according to claim 7, wherein, when the etching depth of the first area to be etched is equal to the target etching depth, the etching depth h of the second area to be etched satisfies the following relation:

$$h=a\times k+[a\times(1-k)]\times m;$$

wherein, a is the target etching depth, k is a first etching ratio, $0<k<1$, m is a ratio of the etching rate of the second area to be etched to the etching rate of the first area to be etched.

9. The manufacturing method according to claim 1, wherein, before performing a first etching on the first area to be etched and the second area to be etched, the manufacturing method further includes:

forming a mask layer on the substrate; and forming a mask opening in the mask layer penetrating the mask layer, and the mask opening is opposite to the first area to be etched and the second area to be etched.

10. The manufacturing method according to claim 2, wherein, before performing a first etching on the first area to be etched and the second area to be etched, the manufacturing method further includes:

forming a mask layer on the substrate; and forming a mask opening in the mask layer penetrating the mask layer, and the mask opening is opposite to the first area to be etched and the second area to be etched.

11. The manufacturing method according to claim 3, wherein, before performing a first etching on the first area to be etched and the second area to be etched, the manufacturing method further includes:

forming a mask layer on the substrate; and forming a mask opening in the mask layer penetrating the mask layer, and the mask opening is opposite to the first area to be etched and the second area to be etched.

12. The manufacturing method according to claim 9, wherein forming an initial target opening connected with the mask opening after the first etching; backfilling the sacrificial material to the first area to be etched and the second area to be etched, filling the mask opening and the initial target opening and covering the mask layer by the sacrificial material.

13. The manufacturing method according to claim 12, wherein, after the backfilling the sacrificial material to the first area to be etched and the second area to be etched, the manufacturing method further comprises:

performing a flattening treatment on the sacrificial material so that a flattened surface of the sacrificial material is flush with a surface of the mask layer.

14. The manufacturing method according to claim 1, wherein forming a bit line contact window after the simultaneously etching the first area to be etched and the second area to be etched at least twice, the first area to be etched is part of an active area, the second area to be etched is part of a shallow trench isolation area.

15. The manufacturing method according to claim 2, wherein forming a bit line contact window after the simultaneously etching the first area to be etched and the second area to be etched at least twice, the first area to be etched is part of an active area, the second area to be etched is part of a shallow trench isolation area.

16. The manufacturing method according to claim 1, wherein, the sacrificial material is formed by chemical vapor deposition or physical vapor deposition.

17. A semiconductor structure, comprising:

a substrate, forming a target opening in the substrate, the target opening is formed by etching at least twice simultaneously on a first area to be etched and a second area to be etched of the substrate, and an etching rate of the first area to be etched is different from an etching rate of the second area to be etched; and in at least two etching processes, a sacrificial material is backfilled in the first area to be etched and the second area to be etched after a previous etching is completed, and part of the sacrificial material is removed in the next etching.

18. The semiconductor structure according to the claim 17, wherein, the target opening is formed by etching twice simultaneously the first area to be etched and second area to be etched, the etching rate of the first area to be etched is less than the etching rate of the second area to be etched;

an etching depth of the first area to be etched is equal to a target etching depth a, and an etching depth h of the second area to be etched satisfies the following relation:

$$a < h \leq a \times k + [a \times (1-k)] \times m;$$

wherein, k is a first etching ratio, $0 < k < 1$, m is the ratio of the etching rate of the second area to be etched to the etching rate of the first area to be etched.

19. The semiconductor structure according to the claim 17, wherein, the target opening is a bit line contact window, the first area to be etched is part of an active area, the second area to be etched is part of a shallow trench isolation area.

20. The semiconductor structure according to the claim 19, wherein a mask layer is formed on the structure, and the mask layer is formed with a mask opening corresponding to the bit line contact window; and a material of the shallow trench isolation area comprises silicon oxide, a material of the active area comprises silicon, and a material of the mask layer comprises silicon nitride.

* * * * *